United States Patent
Dautartas

[19]

[11] Patent Number: 5,964,397
[45] Date of Patent: Oct. 12, 1999

[54] PASSIVE ALIGNMENT OF COMPONENTS WITH MICROMACHINED TOOL

[75] Inventor: Mindaugas Fernand Dautartas, Alburtis, Pa.

[73] Assignee: American Telephone & Telegraph Co., New York, N.Y.

[21] Appl. No.: 08/928,013

[22] Filed: Sep. 11, 1997

Related U.S. Application Data

[63] Continuation of application No. 08/695,512, Aug. 12, 1996, abandoned, which is a continuation of application No. 08/132,023, Oct. 5, 1993, abandoned.

[51] Int. Cl.⁶ .................................................. B23K 37/04
[52] U.S. Cl. .................... 228/180.22; 228/6.2; 228/49.5; 29/834
[58] Field of Search .................................. 228/6.2, 49.5, 228/103, 180.22

[56] References Cited

U.S. PATENT DOCUMENTS

| | | | |
|---|---|---|---|
| 3,355,078 | 11/1967 | Smith | 228/6.2 X |
| 3,589,000 | 6/1971 | Galli | 228/180.22 X |
| 4,528,747 | 7/1985 | Hoffman et al. | 29/834 |
| 4,565,314 | 1/1986 | Scholz | 29/834 X |
| 4,646,435 | 3/1987 | Grassauer | 228/180.22 X |
| 4,712,721 | 12/1987 | Noel et al. | 228/180.22 X |
| 5,656,507 | 8/1997 | Welbourn et al. | 228/180.22 |

FOREIGN PATENT DOCUMENTS

| | | | |
|---|---|---|---|
| 59-127968 | 7/1984 | Japan | 228/49.5 |

*Primary Examiner*—Patrick Ryan
*Assistant Examiner*—Jeffrey T. Knapp

[57] ABSTRACT

A method of fabricating an electronic device uses a micromachined tool that has openings which receive and align components with respect to each other and a substrate. The tool has fiducial marks which align to fiducial marks on the substrate, thereby producing precise alignment of the tool and the substrate. The components are then inserted into the openings, thereby insuring their alignment with respect to the substrate.

10 Claims, 1 Drawing Sheet

PASSIVE ALIGNMENT OF COMPONENTS WITH MICROMACHINED TOOL

This application is a Continuation of application Ser. No. 08/695,512 filed Aug. 12, 1996, which is a continuation of application Ser. No. 08/132,023 filed Oct. 5, 1993, both parent applications now abandoned.

TECHNICAL FIELD

This invention relates to methods for fabricating a device which include the use of a micromachined tool to obtain passive alignment of components of the device with respect to each other on a substrate.

BACKGROUND OF THE INVENTION

Many technological fields require the attachment of one or more components to a substrate with a precise alignment with respect to each other and the substrate. Electrical or optical signals or power may be transferred from, for example, the substrate to the component or between components. The components may be either electrical or optical devices and may be either active or passive devices. For example, integrated circuit chips must be aligned with respect to circuit boards so that they may be soldered or otherwise connected to an electrically conducting pattern on the circuit board. As another example, optical fibers or lenses must be aligned with respect to each other or with respect to a light source so that light may be transmitted through the fibers or lenses. The devices may then be soldered or otherwise aligned and attached to the substrate. In some instances, both optical and electrical signals or power will be transferred between devices and substrate.

As might be expected, a variety of techniques has been developed to position the two or more components with respect to each other and the substrate. Perhaps the conceptually simplest technique may be termed pick and place. One component is picked up and then placed on the substrate in the proper position with the desired alignment with respect to other components. After components are placed on the substrate, they are permanently attached to, for example, solder bumps on the substrate. Photolithographic techniques are frequently used to define the solder bumps. These techniques are capable of great precision. The simplest pick and place technique is done manually; more sophisticated techniques use machines and are highly automated. The pick and place technique is limited to relatively coarse, that is, imprecise, alignments, of components. Thus, pick and place techniques do not have the accuracy that lithographic techniques can achieve.

Self-aligned techniques have been developed in attempts to overcome the problems described above with respect to the accuracy attainable with pick and place techniques and obtain component alignment more precise than that attainable with pick and place techniques. There is also the expectation that, for a given alignment accuracy, self-aligned techniques will be less expensive than are pick and place techniques. See, for example, U.S. Pat. Nos. 4,558,812 and 5,178,723 issued on Dec. 17, 1985 and Jan. 13, 1993, respectively, to Bailey et, al., (Bailey) and Nguyen, respectively, for descriptions of several self-alignment techniques. Bailey teaches methods for batch solder bumping of chip carriers. According to one embodiment described by Bailey, chip carriers are individually placed in apertures in a holder as they are released from a dispensing means. Solder bumps are located in dimples on a plate and form arrays corresponding to bond pad arrays. The holder is moved so that the carriers contact and are then attached to the solder bumps. In one embodiment, Nguyen teaches forming optical devices in which optical components or elements are placed in indentations in one piece and maintained there by means of vacuum channels which communicate with the indentations. A substrate with indentations for receiving the optical elements is brought into contact with the elements and the elements are then bonded to the substrate.

Although the methods described are perfectly adequate for many applications, a method that directly aligns the components to each other and the substrate would be desirable. Such a method would result in improved accuracy over typical pick and place methods. The method should position the components for solder bump attachment with accuracy attained by the photolithographic process used to define the solder bump rather than by the pick and place process.

SUMMARY OF THE INVENTION

According to an exemplary embodiment of this invention, a device having at least one component attached to a substrate is manufactured with the components or component on the substrate aligned both with respect to each other and the substrate. The alignment is achieved by use of a tool with fiducial marks that mate with matching fiducial marks on the substrate and openings that expose portions of the surface of the substrate. The fiducial marks align the tool with respect to the substrate. The openings are adapted to receive the individual components and align them with respect to the substrate. A component is inserted into a opening and is aligned with respect to the substrate when it contacts the substrate surface. The substrate may have an array of, for example, solder bumps for attachment of the component. The component may be inserted into the opening by a pick and place technique. The components are attached to the substrate by, for example, solder, and the tool is removed. In one preferred embodiment, the tool is a micromachined piece of silicon. In another preferred embodiment, the openings are etched and have slanted walls. Several types of components, including lenses and integrated circuits, may be aligned and attached to the substrate.

For reasons of clarity, the elements depicted are not shown to scale.

DETAILED DESCRIPTION

Figure 1:
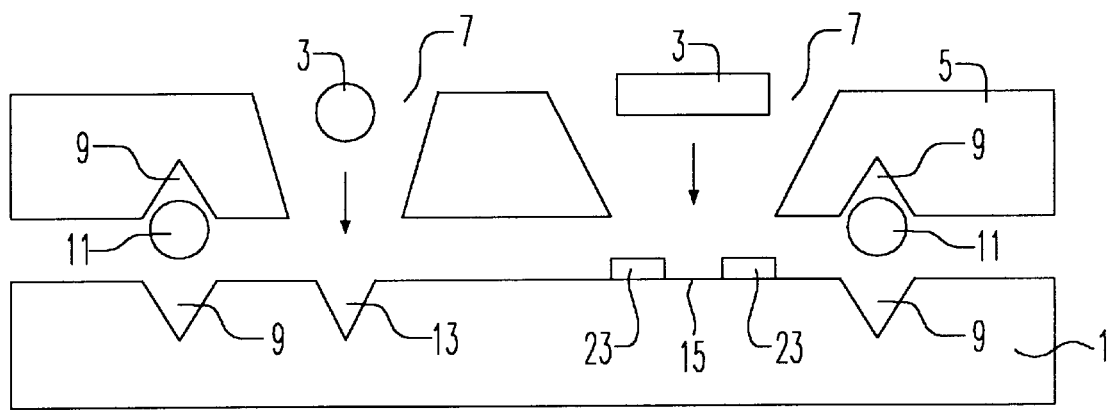
FIG. 1 is a sectional view of the tool, components, and substrate.

The invention will be described by reference to an exemplary embodiment which aligns several components with respect to a substrate and then attaches the components to the substrate. FIG. 1 is a sectional view depicting the substrate 1, a plurality of components 3, and a tool 5. As can be seen, tool 5 has a plurality of openings 7 which expose selected portion of the substrate 1. The components 3 ultimately contact the substrate surface or features on the substrate surface although they are depicted in the process of being inserted into the openings by, for example, pick and place apparatus which is well known and not depicted. Both the tool 5 and the substrate 1 have mating fiducial marks 9 that facilitate alignment of the two components with respect to each other. The fiducial marks 9 are recesses, typically pyramidal shaped, into which objects 11 are placed. The objects 11 depicted are spheres and are typically attached to either the tool 5 or the substrate 1. There are fiducial marks on the tool and the substrate and they mate with each other. There are two openings 7 depicted in the tool; one exposes a pyramid 13 in the substrate and the second exposes a plurality of bond pads 15 on the substrate surface. The two openings receive different components 3; the first receives a sphere and the second a die. The sphere functions as a lens and the die contains, for example, an integrated circuit or a plurality of opto-electronic devices.

Figure 2:
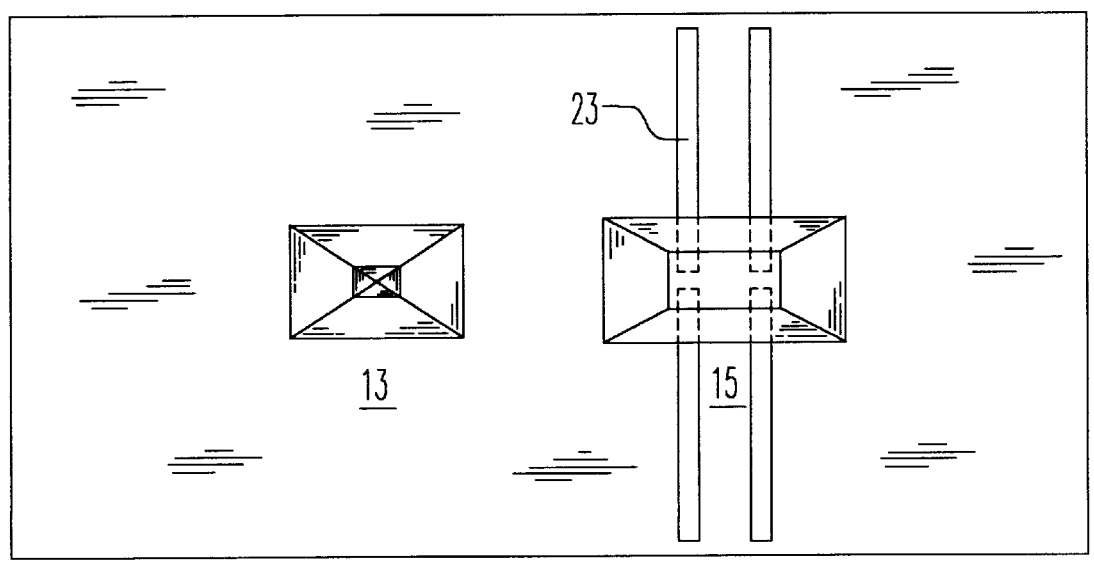
FIG. 2 is a top view depicting the same elements.

A top view of the elements depicted is shown is FIG. 2. The substrate surface also has electrically conducting patterns 23 as shown. These patterns are used to provide paths for the electrical input and output signals as well as electrical power to the die having an integrated circuit or other types of circuits; of course, the substrate will typically have more electrically conducting patterns than are shown.

The structures depicted will be readily fabricated by those skilled in the art. The fiducial marks, including the pyramids in the substrate, can be fabricated using conventional techniques. For example, the substrate surface may be coated with a photoresist and selected portions exposed to radiation. The resist is then developed and selected portions of the surface are exposed. A wet etch is then used to form, for example, the pyramids. Exemplary wet etches include KOH (potassium hydroxide) and EDP (ethylene diamine pyrocatechol). Conventional techniques can be used to form the solder bumps and electrically conducting patterns on the substrate surface. Of course, both pyramids and solder bumps can be formed on the surface although two patterning steps may be required.

The micromachined tool can be formed by means of conventional lithographic patterning and etching techniques. Two patterning steps will likely be required; one for the fiducial marks and the other for the openings. That is, one step for each side. An oxide may be deposited prior to patterning. The oxide on the surface opposite the opening acts to stop the etch when it is reached. After one side is etched, oxide may be deposited on the same silicon surfaces before the second side is patterned. Appropriate dimensions for the openings will be readily selected considering the sizes components to be attached. The same comment is also applicable to the fiducial marks. At least three fiducial marks are desirable. Overetching of fiducial marks may not be critical; the center-to-center spacing of the fiducial marks does not change. Wet etching is expediently used to form the openings because many wet etches, such as those previously mentioned, form openings with slanted walls. The walls are slanted so that the openings are larger further from the substrate than they are near the substrate.

Fabrication of the components, for example, lenses, opto-electronic devices, integrated circuit, is also well known and need not be described. It is contemplated that some artisans practicing this invention may purchase the components for fabrication of the final device rather than manufacturing the components. Obviously, selection of components will depend upon the final device fabricated.

Materials for both the tool and the substrate will be readily selected by those skilled in the art. The tool and the substrate can be expediently fabricated from silicon. This material is desirably used because it is readily patterned and etched to form both fiducial marks and openings. An exemplary orientation for the silicon is <100>. Other orientations may be used considering the shapes of the openings that will be formed and the etch used. The tool may be oxide coated or aluminum coated if desired. A coating is desirable in many embodiments because it will facilitate removal of the tool after attachment or bonding of the devices to the substrate has been completed. As previously discussed, the coating may also facilitate control of the etching of openings and fiducial marks. The coating should be formed from a material that is, for example, not wetted by solder if solder is used to attach the components to the substrate. The spheres may be fabricated from any convenient material. It is desirable that the spheres be attached to the tool so that they may be conveniently reused. The pieces that is, devices, that are attached to the substrate may be any optical, opto-electronic or electronic device whether discrete or integrated or passive or optical. Of course, both optical and electronic pieces may be attached.

The tool need not be the originally formed tool. The originally formed tool may be duplicated using well known molding techniques. The duplicate tool may be formed from inexpensive materials such as plastics. Although a plastic copy will not have as much dimensional accuracy as did the original silicon tool, the dimensional errors are likely to be less than several tens of microns. This accuracy is sufficient for positioning many types of devices on the substrate.

The formation of the device with the self-aligned component is readily understood. The tool is positioned with respect to the substrate using a pick and place technique. The fiducial marks described, namely, the pyramids and the sphere in one pyramid, are self-aligned providing that the initial pick and place alignment is approximately accurate. That is, the spheres will contact the bottoms of the pyramids in the substrate and the tool. The devices are then inserted into the openings, and because of the slanted walls, fall to and contact the substrate surface. Due to both the shape and size of the openings at the substrate surface, the devices are self-aligned with respect to the substrate surface and any features, for example, solder bumps or electrically conducting patterns, on the substrate surface. A pick and place techniques may be used to insert the components into the openings. The pick and place technique may be relatively inaccurate. The self-alignment process insures that the accuracy of the alignment achieved will likely be greater than that obtained with the pick and place technique alone as it is determined by the accuracy of the tool patterning. Accordingly, there is improved accuracy of alignment of the components with respect to, for example, the solder bumps or other components or patterns on the substrate. The accuracy achieved lithographically with respect to solder bump formation is thus retained.

After alignment has been completed, the components are attached to the substrate. This may be through, for example, soldering, with the tool remaining in place during the attachment process. After the attachment is completed, the tool is removed and may be reused. Alternatively, the tool may be removed and other attachment processes, such as thermo-compression bonding, used.

Variations in the embodiment described will be readily thought of by those skilled in the art. In particular, other fiducial marks may be used. For example, a trench may be etched in the substrate and a mating wall formed on the tool. Dry etching techniques may be used to form these fiducial marks.

I claim:

1. A method of manufacturing a device having at least a first component attached to a substrate comprising the steps of:

aligning a tool with respect to said substrate, said tool and said substrate having mating fiducial marks for alignment, said tool having at least one opening which exposes at least a portion of said substrate, said at least one opening having inwardly sloping walls toward the substrate surface;

inserting said at least first component into said at least one opening, said first component contacting said substrate and being aligned with respect to said substrate;

attaching said at least a first component to said substrate; and removing said tool.

2. A method as recited in claim 1 in which said removing occurs subsequent to said attaching.

3. A method as recited in claim 1 in which said removing occurs prior to said attachment.

4. A method as recited in claim 1 in which said substrate comprises silicon.

5. A method as recited in claim 1 in which said fiducial marks comprise pyramids and a sphere adapted to fit into said pyramids.

6. A method as recited in claim 1 in which said attaching step comprises heating.

7. A method as recited in claim 1 in which said heating attaches said solid component to said substrate with solder.

8. A method as recited in claim 1 in which said tool comprises silicon.

9. A method as recited in claim 8 in which said tool further comprises a coating.

10. A method as recited in claim 9 in which said coating is selected from the group consisting of aluminum and oxides.

* * * * *